(12) United States Patent
Batude et al.

(10) Patent No.: US 9,379,213 B2
(45) Date of Patent: Jun. 28, 2016

(54) METHOD FOR FORMING DOPED AREAS UNDER TRANSISTOR SPACERS

(71) Applicants: COMMISSARIAT A L'ENERGIE ATOMIQUE ET AUX ENE ALT, Paris (FR); STMICROELECTRONICS SA, Montrouge (FR)

(72) Inventors: Perrine Batude, Dijon (FR); Jean-Michel Hartmann, Le Versoud (FR); Benoit Sklenard, Grenoble (FR); Maud Vinet, Rives sur Fure (FR)

(73) Assignees: Commissariat a l'energie atomique et aux energies alternatives, Paris (FR); STMICROELECTRONICS SA, Montrouge (FR)

(*) Notice: Subject to any disclaimer, the term of this patent is extended or adjusted under 35 U.S.C. 154(b) by 0 days.

(21) Appl. No.: 14/450,385

(22) Filed: Aug. 4, 2014

(65) Prior Publication Data
US 2015/0044841 A1    Feb. 12, 2015

(30) Foreign Application Priority Data
Aug. 9, 2013    (FR) ...................... 13 57931

(51) Int. Cl.
| | |
|---|---|
| H01L 21/336 | (2006.01) |
| H01L 29/78 | (2006.01) |
| H01L 29/66 | (2006.01) |
| H01L 21/02 | (2006.01) |
| H01L 29/16 | (2006.01) |
| H01L 29/417 | (2006.01) |
| H01L 29/786 | (2006.01) |
| H01L 29/161 | (2006.01) |
| H01L 21/265 | (2006.01) |
| H01L 21/28 | (2006.01) |

(52) U.S. Cl.
CPC .... *H01L 29/66568* (2013.01); *H01L 21/02532* (2013.01); *H01L 21/02592* (2013.01); *H01L 21/02667* (2013.01); *H01L 29/16* (2013.01); *H01L 29/41766* (2013.01); *H01L 29/66628* (2013.01); *H01L 29/66636* (2013.01); *H01L 29/66772* (2013.01); *H01L 29/78654* (2013.01); *H01L 21/26506* (2013.01); *H01L 21/26586* (2013.01); *H01L 21/2807* (2013.01); *H01L 21/28088* (2013.01); *H01L 29/161* (2013.01); *H01L 29/6653* (2013.01); *H01L 29/6656* (2013.01); *H01L 29/7848* (2013.01)

(58) Field of Classification Search
None
See application file for complete search history.

(56) References Cited

U.S. PATENT DOCUMENTS

| | | |
|---|---|---|
| 6,881,635 B1 | 4/2005 | Chidambarrao et al. |
| 2009/0170268 A1 | 7/2009 | Teo et al. |

(Continued)

OTHER PUBLICATIONS

U.S. Appl. No. 14/441,354, filed May 7, 2015, Vinet, et al.

(Continued)

*Primary Examiner* — Pamela E Perkins
(74) *Attorney, Agent, or Firm* — Oblon, McClelland, Maier & Neustadt, L.L.P.

(57) ABSTRACT

Method for fabricating a transistor comprising the steps consisting of:
- forming sacrificial zones in a semi-conductor layer, either side of a transistor channel zone,
- forming insulating spacers on said sacrificial zones against the sides of the gate of said transistor,
- removing said sacrificial zones so as to form cavities, with the cavities extending on either side of said channel zone and penetrating under said spacers,
- forming doped semi-conductor material in said cavities, with said semi-conductor material penetrating under said spacers.

16 Claims, 10 Drawing Sheets

(56) References Cited

U.S. PATENT DOCUMENTS

| | | |
|---|---|---|
| 2009/0289379 A1 | 11/2009 | Han et al. |
| 2010/0224938 A1* | 9/2010 | Zhu .............................. 257/369 |
| 2015/0044828 A1 | 2/2015 | Batude et al. |
| 2015/0056734 A1 | 2/2015 | Grenouillet et al. |

OTHER PUBLICATIONS

U.S. Appl. No. 14/579,069, filed Dec. 22, 2014, Reboh, et al.
U.S. Appl. No. 14/425,977, filed Mar. 4, 2015, Vinet, et al.
U.S. Appl. No. 14/425,891, filed Mar. 4, 2015, Grenouillet, et al.
Olaf Hellman, "Topics in solid phase epitaxy: strain, structure and geometry" Materials Science and Engineering, vol. 16, No. 1, 1996, pp. 1-42.
K. Cheng, et al., "Extremely Thin Soi (ETSOI) CMOS with Record Low Variability for Low Power System-on-Chip Applications" Electron Devices Meeting, 2009, pp. 3.2.1-3.2.4.
Ming H. Yu, et al., "Relaxation-Free Strained SiGe with Super Anneal for 32nm High Performance PMOS and beyond" Electron Devices Meeting, 2006, 4 Pages.
French Preliminary Search Report issued Mar. 14, 2014, in Patent Application No. FR 1357931, filed Aug. 9, 2013 (with English Translation of Category of Cited Documents).

* cited by examiner

METHOD FOR FORMING DOPED AREAS UNDER TRANSISTOR SPACERS

TECHNICAL FIELD AND STATE OF PRIOR ART

The MOS field effect transistor is based on charges concentration modulation in a channel zone by means of a gate electrode situated above the channel and insulated from all other regions of the device by a dielectric gate. Such a transistor moreover comprises source and drain regions arranged on each side of the channel zone and which can be formed in the same semi-conductor layer as that in which the channel is located.

Figure 1A:
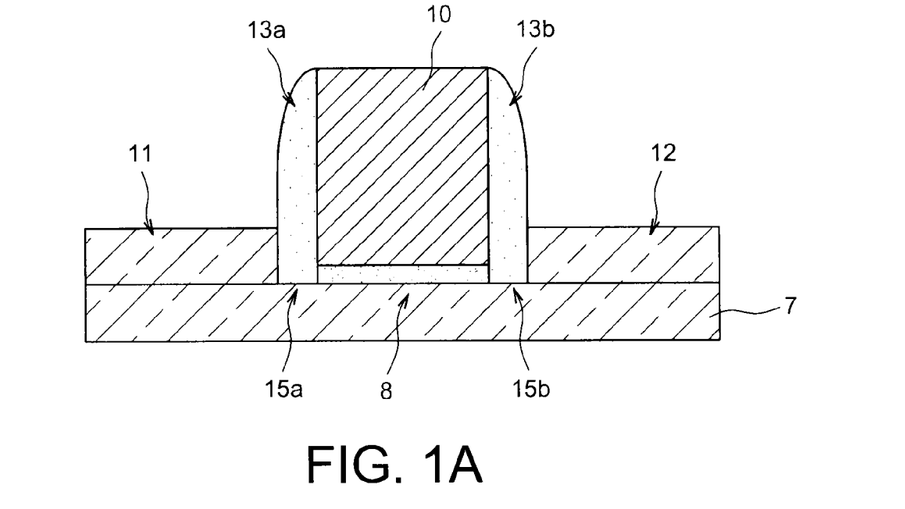
FIGS. 1A-1B illustrate the completion of doped areas under the insulating spacers of a MOS transistor.

In order to improve the transistor performances, a solution consists of implementing raised source and drain regions 11, 12, that is to say which are at least partially formed in semi-conductor regions extending either side of a gate 10, above a semi-conductor layer 7 in which a channel 8 is formed (FIG. 1A).

The raised source 11 and drain 12 regions are generally formed by epitaxial growth during which they may be doped.

Insulating spacers 13a and 13b arranged against the lateral sides of the gate are provided between the gate 10 and the source 11 and drain 12 regions.

In order to limit the resistance between the channel zone and the source and drain regions, it has been sought to dope areas 15a, 15b of the semi-conductor layer 7 located under the spacers and which are located at the boundary of the channel zone.

The doping of these areas 15a, 15b may comprises a thermal annealing carried out after the epitaxy step of the source and drain regions.

This thermal annealing step poses a problem to the extent that it requires a significant thermal budget.

In conjunction with low temperature transistors' fabrication methods, that is to say at least lower than 700° C., the doping of areas 15a 15b, is thus generally achieved by implantation, also followed by thermal annealing, but requiring a lower thermal budget.

This annealing must be preferably carried so as not to dope the channel zone.

Figure 1B:
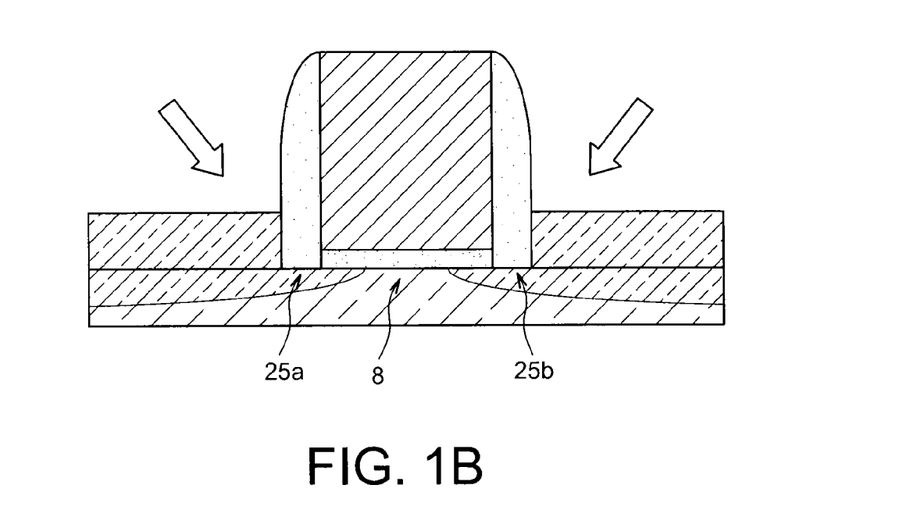

FIG. 1B illustrates doped areas 25a, 25b under the spacers 13 which haven't been well defined, to the extent that they extend to the semi-conductor area that is opposite the gate and provided for the channel. These doped areas 25a, 25b thus encroach upon the channel zone.

To avoid too significant overlap, a solution might consist of forming doped areas under the spacers by implant.

However this solution may then require the implementation of additional photolithography step(s).

Implant doping further causes a problem when the semi-conductor layer to be doped is based on a material that is different from that of the semi-conductor areas formed by epitaxy on either side of the gate.

When this material is provided to induce strain, implant can may induce strain relaxation.

There is then the problem of finding a new method, for forming a transistor with better performances and, improved as regards the aforementioned disadvantages.

DISCLOSURE OF THE INVENTION

According to an embodiment of the present invention, it is provided a method for forming a microelectronic transistor(s) device comprising the following steps:
   formation of sacrificial zones in a semi-conductor layer with the sacrificial zones being achieved either side of the given area of this semi-conductor layer in which a transistor channel is to be formed.
   formation against a gate of said transistor resting on said given area of insulating spacers resting on said sacrificial zones,
   removal of said sacrificial zones so as to form cavities, with the cavities extending on either side of said given area under the spacers,
   formation of a semi-conductor material in said cavities and penetrating under the spacers, with the semi-conductor material formed in the cavities and penetrating under the spacers being doped.

Such a method enables the definition of doped areas on either side of the channel zone and penetrating under the spacers while limiting the number of implemented steps, especially photolithography steps.

This method further enables the precise definition of doped areas penetrating under the spacers without overlapping the channel zone.

Such a method further enables the formation of semi-conductor doped areas under the spacers and in contact with the channel zone, without necessarily having to achieve an implantation under the spacers in order to carry out such doping.

The semi-conductor material formed in the cavities and penetrating under the spacers may be adapted to exert strain. In this case, such a method enables the application of this strain as close as possible to the channel.

By material adapted to induce strain, it is understood that this semi-conductor material is different from that of said given area and chosen so as to be able to pull the atoms of the material from said given area beyond their ordinary interatomic distance.

The formation of the semi-conductor material in the cavities may comprise at least one epitaxy growth step.

Advantageously, said semi-conductor material is then doped during growth by epitaxy in the cavities. An in situ doping of said semi-conductor material may be achieved during this or these epitaxies.

Preferably, said sacrificial zones are based on a sacrificial material, provided so as to be etched selectively with respect to the rest of said semi-conductor layer. This sacrificial material may be a semi-conductor material.

In accordance with a first possibility of implementation, the sacrificial zones can be formed by:
   formation of cavities in the semi-conductor layer on either side of said transistor's gate,
   filling of the cavities with a sacrificial material.

The semi-conductor layer may, for example, be silicon (Si) based, whereas the sacrificial zones are SiGe based.

Alternatively, the semi-conductor layer may be $Si_xGe_y$ based, whereas the sacrificial zones may be $Si_aGe_b$ based (with b>y).

According to a second possibility of implementation, the sacrificial zones, may be zones of a crystalline semi-conductor material layer which has been rendered amorphous.

In this case, the insulating spacers are formed by depositing a dielectric material and preferably subsequently to the formation of the sacrificial zones. The thermal budget of the dielectric material deposition is chosen so as to preserve the amorphous nature of the sacrificial zones or so as to induce a re-crystallisation only from a very thin thickness of sacrificial zones.

Notably, the temperature and the duration of the deposition are chosen to be lower with regard respectively to a threshold temperature and a threshold duration depending on the semi-conductor material of the sacrificial zones.

The insulating spacers can be formed directly in contact with the gate.

In accordance with a specific implementation of the method in which the gate comprises a metal area, protection zones against the gate covering said metal area can be achieved prior to the formation of the sacrificial zones.

Thus a contamination of the equipment(s), in which the sacrificial semi-conductor material formation step in the cavities is achieved, can be avoided.

Advantageously, raised source and drain regions are formed. <<Raised>> means that the source and drain regions are arranged on either side of the gate and extend at least partially above said semi-conductor layer in which the channel zone is provided.

A microelectronic device implemented with an aforementioned method is further provided.

BRIEF DESCRIPTION OF THE DRAWINGS

The present invention shall be better understood on the purely indicative and not restrictive reading of the description of the given models for completion, by making reference to the appended drawings on which.

Identical parts, similar or equivalent in the different figures bear the same numerical references so as to facilitate the passing from one figure to another.

The different parts shown on the Figure do not necessarily follow a uniform scale so as to make the figures more legible.

DETAILED DISCLOSURE OF PARTICULAR EMBODIMENTS

An example method according to an embodiment of the invention, for fabricating a microelectronic transistor(s) device, will now be described in connection with FIG. 2A-2F.

Figure 2A:
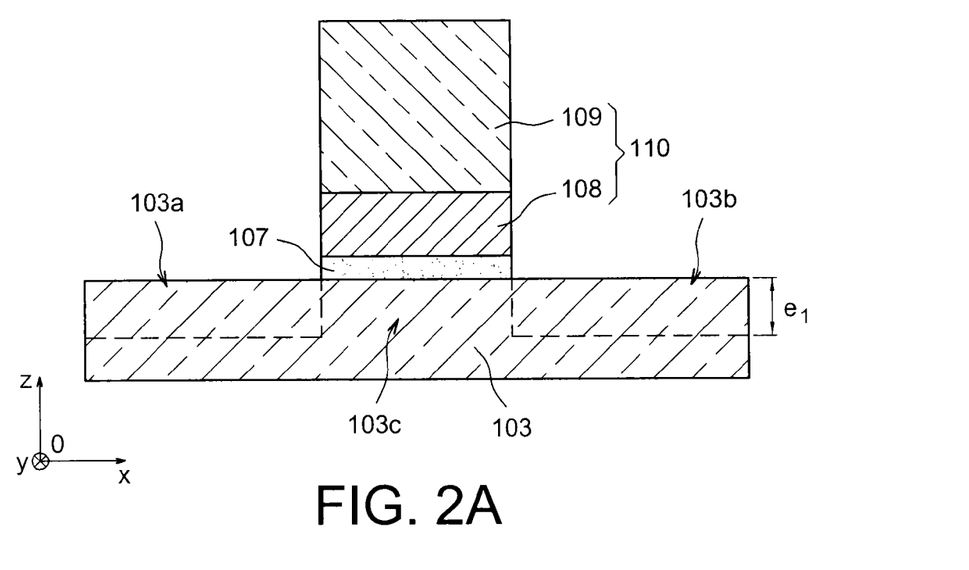
FIGS. 2A-2F illustrate an example of transistor implementation method wherein, a doped semi-conductor material is formed under transistor spacers by filling cavities formed beforehand under these spacers.

The starting material for this method can be a semi-conductor on insulator type substrate, SOI (SOI for <<silicon on insulator>>) type for example, which comprises a semi-conductor support layer (not represented) on and in contact with an insulating layer (not represented) which can be silicon oxide based and arranged on and in contact with the support layer. The substrate further comprises a thin semi-conductor layer 103 situated on and in contact with said insulating layer.

This thin semi-conductor layer 103 can, for example, have a thickness of less than 20 nm and that may, for example, be approximately 12 nm.

Deposition steps of a dielectric gate layer 107 and of one or several layers 108, 109 of gate material(s), and then etching of these layers are then carried out in order to form a transistor gate 110 (FIG. 2A).

This transistor's gate 110 can be formed by a stack comprising a TiN based metal layer on which, for example, a semi-conductor polysilicon based layer rests.

Figure 2B:
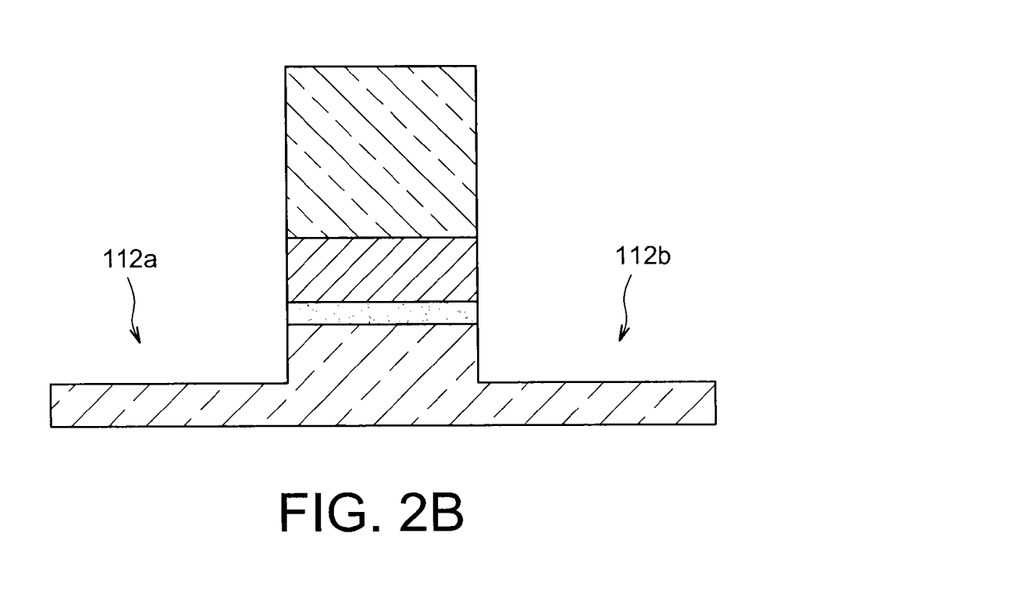

Then, a removal step of blocks 103a, 103b of the thin semi-conductor layer 103 is conducted. The removed blocks 103a, 103b are situated on either side of an area 103c of the thin semi-conductor layer 103 that is opposite the gate 107 and that is to form a transistor channel zone.

This removal may be achieved by anisotropic etching, e.g by HCl (hydrochloric acid), and enables the formation of cavities 112a, 112b arranged around the area 103c delimiting the transistor's channel zone (FIG. 2B).

The etched portion of the thin conductor layer 103 can be less than the total thickness of this thin conductor layer 103 to form cavities 112a, 112b, and, for example, approximately 6 to 9 nm. Thus, a portion of the thin semi-conductor layer 103 is preserved under the cavities 112a, 112b.

Figure 2C:
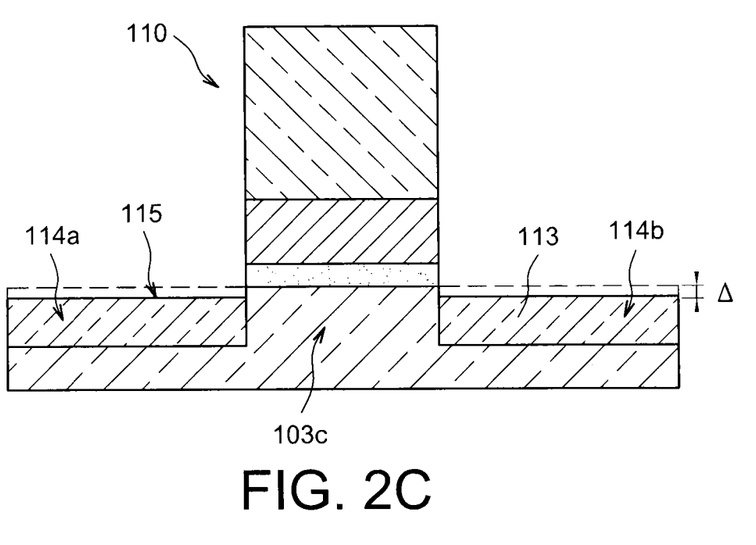

Then cavities 112a, 112b are filled with a sacrificial material 113, so as to form 114a, 114b sacrificial zones on either side of the gate 110, and which are intended to be withdrawn later.

The thickness of the sacrificial zones 114a, 114b is provided to be preferably less than that $e_1$ of blocks 103a, 103b of the thin semi-conductor layer 103 which were withdrawn previously.

Thus, the upper side of the thin conductor layer 103, on which the gate 110 rests, projects slightly beyond the upper sides 115 of sacrificial zones 114a, 114b (FIG. 2C). A deviation or a projection length Δ of approximately 1 nm or 2 nm, for example, can be provided with this in order to avoid creation, later on, of short-circuits between the gate and the source and drain regions.

The cavities' filling sacrificial material 113 is preferably a material chosen in a way for selective etching against that of the thin semi-conductor layer 103. The sacrificial material 113 can be a semi-conductor material such as $Si_xGe_y$, for example with y, for example, being approximately 0.3. When the sacrificial material 113 is a semi-conductor material, the latter can be formed by epitaxy growth starting from the thin semi-conductor layer 103. This enables a precise check of the thickness of the sacrificial zones 114a, 114b to be achieved.

Then (FIG. 2D), insulating spacers 118a, 118b are formed against the gate's lateral sides 110, said spacers resting on areas 114a, 114b of sacrificial material 113. Areas 114a, 114b of sacrificial material 113 are thus used to support the insulating spacers 118a, 118b.

Figure 2D:
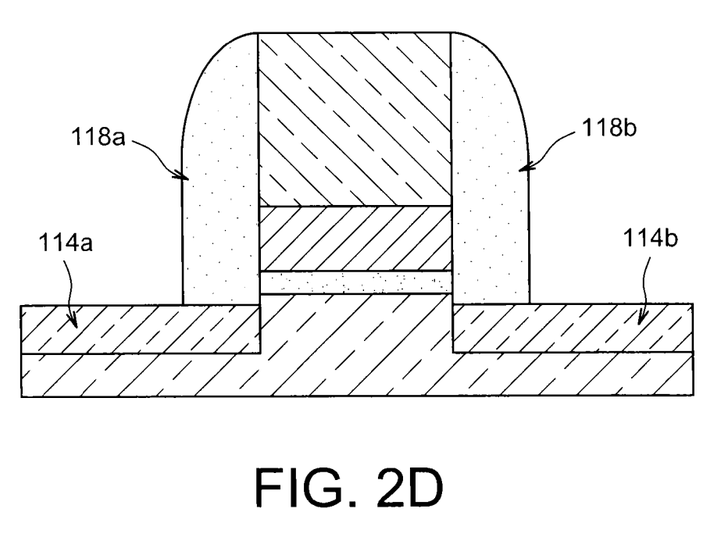

The insulating spacers 118a, 118b can be achieved by depositing a dielectric material layer such as $Si_3N_4$ for example, of a thickness of approximately 10 nm, and then by the etching this dielectric material.

Figure 2E:
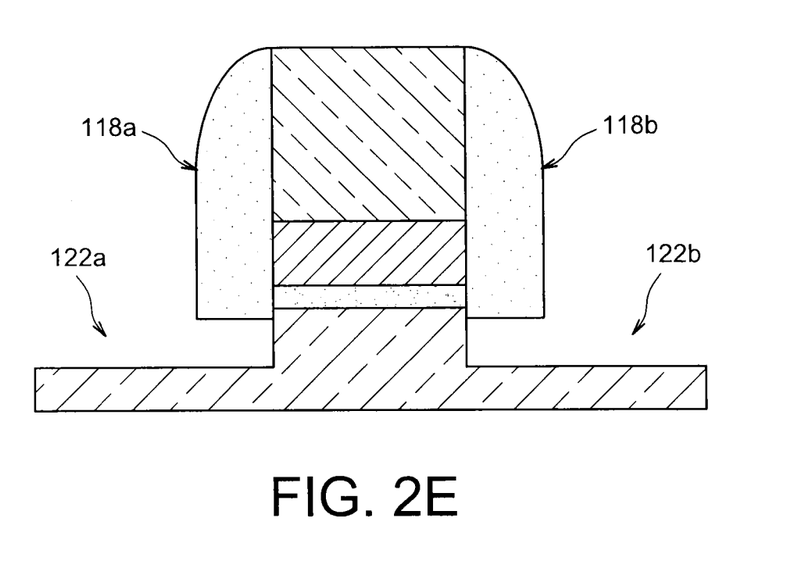

Then, a removal of areas 114a, 114b under the spacers 118a, 118b is carried out, preferably with the help of a selective and isotropic etching of the sacrificial material 113 against that of the thin semi-conductor layer 103 (FIG. 2E).

In the case where the thin semi-conductor layer 103 is Si based and the sacrificial material 113 is of SiGe, a selective etching e.g. by HCl may be implemented.

Thus cavities 122a, 122b can be obtained again, around the channel zone 103c, with these new cavities 122a, 122b also being arranged here so as to extend under the insulating spacers 118a, 118b.

Figure 2F:
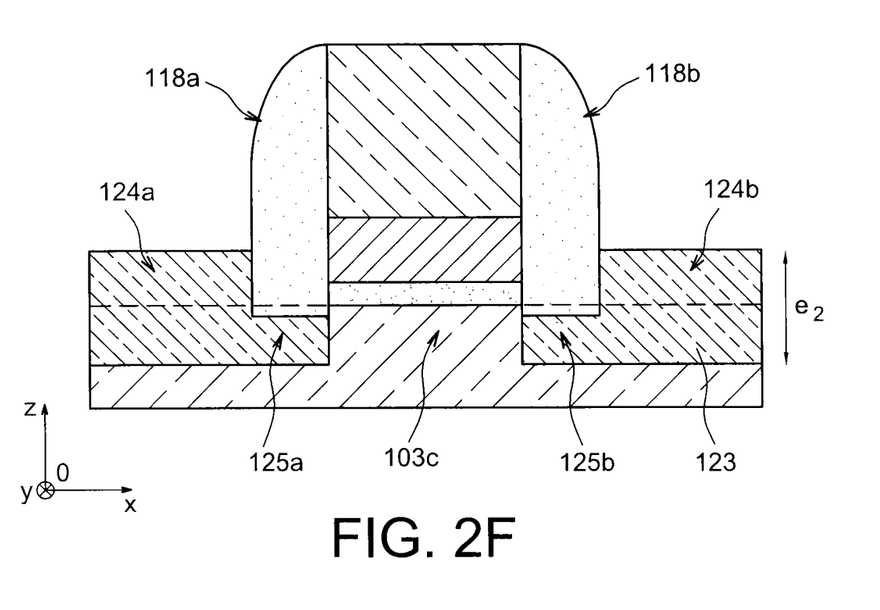

Cavities 122a, 122b penetrating under the insulating spacers 118a, 118b are then filled with a semi-conductor material 123, so as to form source and drain semi-conductor blocks 124a, 124b (FIG. 2F). The semi-conductor material 123 can be doped so that doped areas 125a, 125a from blocks 124a, 124b and which are situated under spacers 118a, 118b are formed on either side of the transistor channel zone 103c.

In this embodiment, the semi-conductor blocks 124a, 124b are achieved with the help of one or several subsequent epitax(ies) of semi-conductor material that is grown from the remaining thickness of the thin semi-conductor layer 103. During the epitaxy or epitaxies, an in-situ doping of the semi-conductor blocks 124a, 124b is carried out.

The semi-conductor blocks 124a, 124b may have a height or thickness $e_2$ greater than the thickness $e_1$ of zones 103a, 103b of the thin semi-conductor layer 103 which were withdrawn previously (the $e_1$ and $e_2$ thicknesses being measured in a direction parallel to the z axis of the orthogonal reference marker [O,x,y,z] indicated on FIGS. 2A and 2F). Thus, the semi-conductor blocks 124a, 124b project beyond the upper face of the channel zone 103c.

The doped semi-conductor blocks 124a, 124b thus extend above the upper face of the thin semi-conductor layer 103 and comprise a part which extends under the spacers 118a, 118b.

Thus the source and drains doped regions which are raised in comparison with the channel zone 103c on which the transistor gate rests 110 are achieved, and penetrate under spacers 118a, 118b so as to be in contact with the lateral sides of the channel zone 103c.

In a case where a PMOS type transistor is formed, the semi-conductor material 123 of blocks 124a, 124b can be adapted to induce compressive strain on the transistor's channel zone 103c. In this case, the semi-conductor material 123 for filling up the cavities can be, for example silicon-germanium based, and in particular boron doped.

In the case where a NMOS type transistor is formed, the semi-conductor material 123 of blocks 124a, 124b can be adapted to induce tensive strain on the transistor's channel zone 103c. In this situation, the semi-conductor material 123 formed against the channel zone can, for example, be SiC based and doped in particular with phosphorous.

Figure 3A:
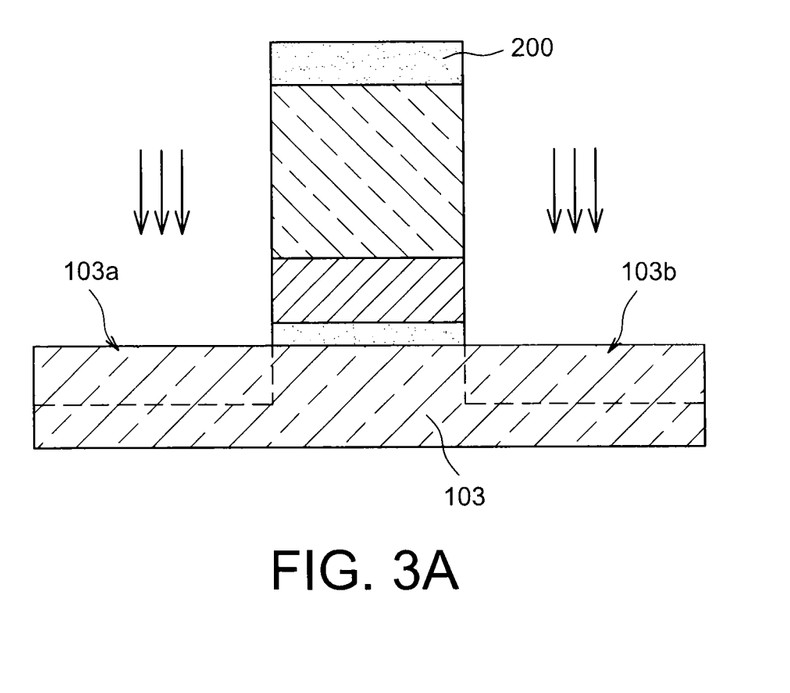
FIGS. 3A-3E illustrate an alternative of a transistor's fabrication method wherein cavities are formed under the transistor's spacers by etching the zones of a semi-conductor material made amorphous, with these cavities then being filled by a doped semi-conductor material and/or adapted to apply mechanical strain, and which is arranged in contact with the transistor's channel zone.
Figure 3B:
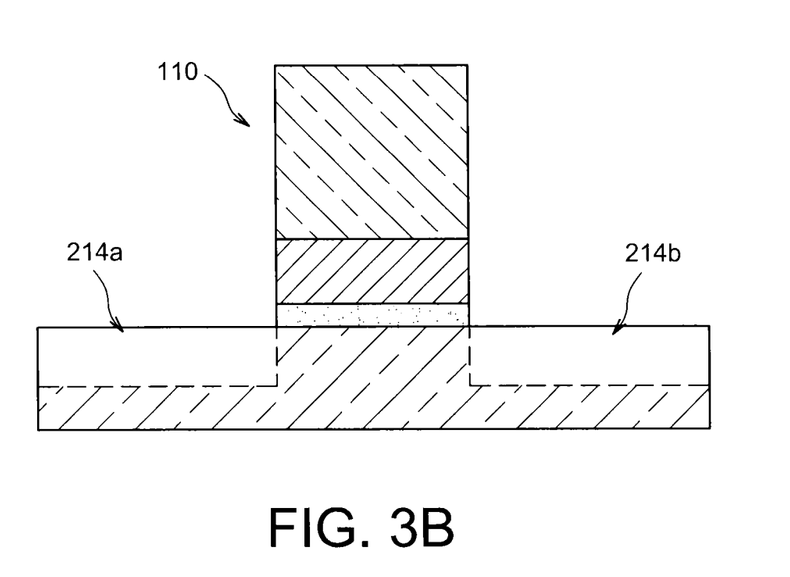

An alternative to the method which has just been described, is illustrated in FIGS. 3A-3B.

According to this alternative, sacrificial zones are formed by making certain areas of the thin semi-conductor layer 103 amorphous.

For this, after having formed the gate 110, an implantation of the layer 103 can be achieved which can, for example, be Si crystalline based. One implant in particular blocks 103a, 103b of the thin semi-conductor layer 103 situated on either side of an area 103c of this thin semi-conductor layer 103 that is arranged relative to gate 107 and intended to form a transistor channel zone.

This amorphisation implantation of blocks 103a, 103b of semi-conductor material can be achieved via a masking 200 formed on the gate 110, and with the help of a non doping species such as Ge or Si for example.

At the end of the implantation step, amorphous sacrificial zones 214a, 214b are obtained. These sacrificial zones 214a, 214b are intended to be withdrawn later.

Then (FIG. 3C), insulating spacers are formed 118a, 118b against the lateral sides of the gate 110. The insulating spacers 118a, 118b rest on the sacrificial zones 214a, 214b of semi-conductor material rendered amorphous.

Figure 3C:
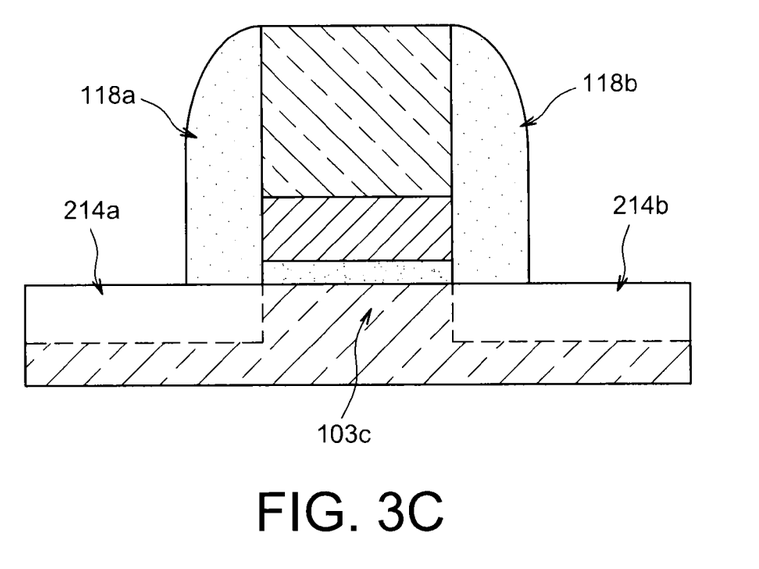

So as to preserve the amorphous nature of the sacrificial zones 214a, 214b, the insulating spacers 118a, 118b can be formed by a deposition which thermal budget, particularly the time/temperature couple, is selected as sufficiently low so as not to induce recrystallisation or to induce a superficial recrystallisation of the sacrificial zones 214a, 214b of a thickness not exceeding 2 nm.

For example, in the case of silicon zones, a thermal budget of 500° C. can be provided with a duration of less than 1 min or 450° C. with a duration of less than 10 min in the case where the material of layer 103 and of areas 214a, 214b is silicon. In the case, for example, of non doped Si or SiGe based areas, the maximum thermal budget for not recrystallising access can be determined from the reference: O. Hellman et al. Materials Science and engineering : R Reports volume 16 issue 1, 1996 p 1-42

Then steps of the type of those given in the previously described example of method are achieved.

Figure 3D:
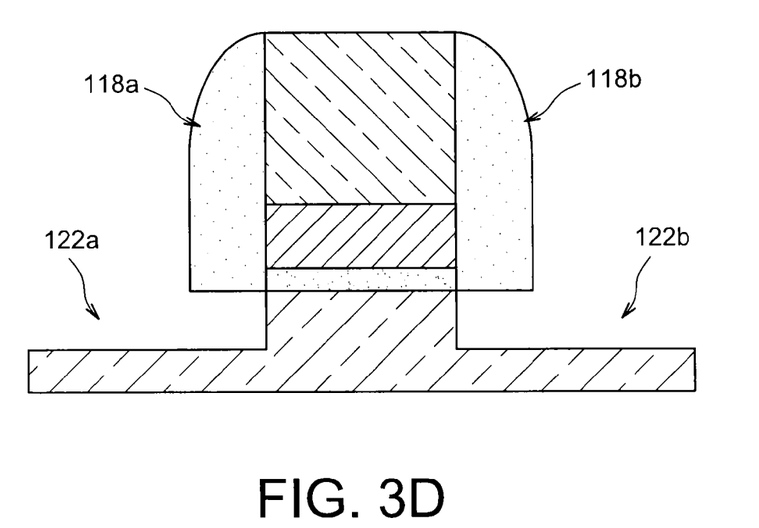

Thus, a selective removal of sacrificial zones 214a, 214b is firstly carried out. This removal can be achieved by etching for example with the help of HCl when the layer 103 is Si crystalline based and the zones 214a, 214b are amorphous Si based.

The cavities 122a, 122b which extend under the spacers 118, 118b and either side of the channel zone 103c are thus obtained (FIG. 3D).

Figure 3E:
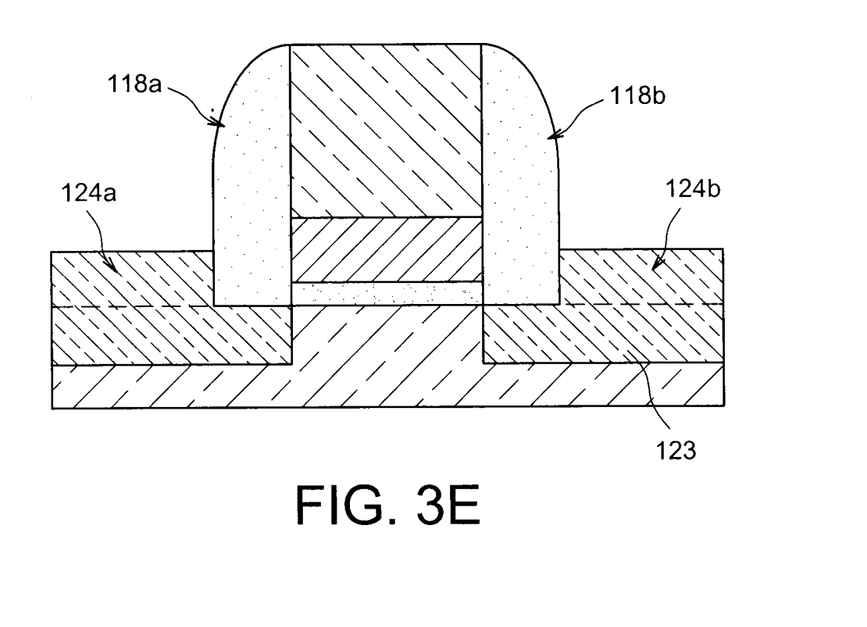

These cavities 122a, 122b are then filled up with a semi-conductor material 123, doped and/or adapted to induce strain on the channel zone 103c.

Thus the raised source and drain semi-conductor blocks 124a, 124b are formed (FIG. 3E).

Figure 4A:
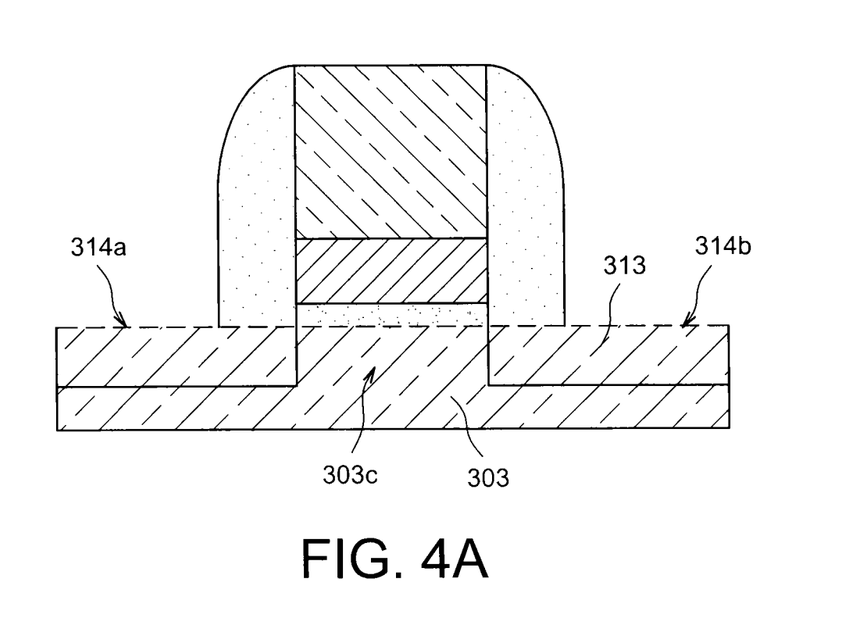
FIG. 4A-4B illustrate another alternative in the transistor fabrication method wherein the cavities are formed under the transistor's spacers by a selective etching of the semi-conductor material based sacrificial zones against another semi-conductor material and then filled by a semi-conductor material that is doped and/or adapted to apply strain on the transistor channel.

According to another alternative, when the transistor is for example of PMOS type, this transistor channel 303c can be provided in a $Si_xGe_y$ based semi-conductor layer 303.

$Si_aGe_b$ based sacrificial zones 314a, 314b may then be formed either side of the gate 110 with b>y and a<x (FIG. 4A). Then, spacers 118a, 118b are formed on these zones 114a, 114b (FIG. 4A).

Figure 4B:
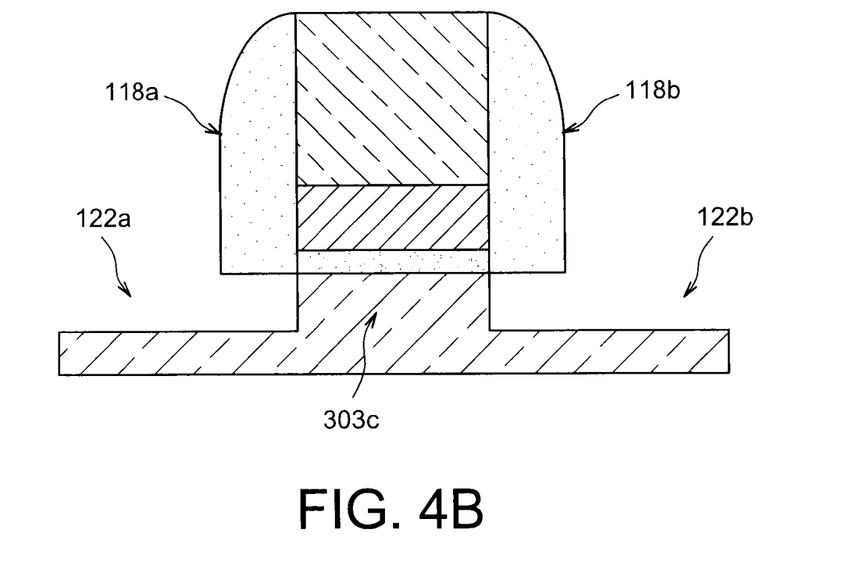

A selective etching of $Si_aGe_b$ based sacrificial zones 314a, 314b is then be carried out against the $Si_xGe_y$ layer 303, having a higher Ge concentration than that of these areas, so as to specifically form cavities 122a, 122b under the spacers 118a, 118b without etching the channel zone.

This etching can be achieved with HCl for example, at a low temperature, for example less than 700° C.

Then, the source and drain regions are formed, for example in a manner such as described previously in connection with FIG. 2F. An epitaxy growth of a semi-conductor material 123 in the cavities 122a, 122b is carried out. The semi-conductor material 123 is in contact with the channel zone 303c and penetrates under the spacers 118a, 118b. This semi-conductor material 123 is doped and/or adapted to induce strain on the transistor channel area 303c.

According to another implementation alternative (FIG. 5A-5C) of the method described previously in connection with FIG. 2A-2F, specifically when the gate 110 comprises a metal layer 108, said <<masking>> areas 509a, 509b can be formed against the lateral sides of the gate 110, so as to mask the gate's metallic area 108.

Figure 5A:
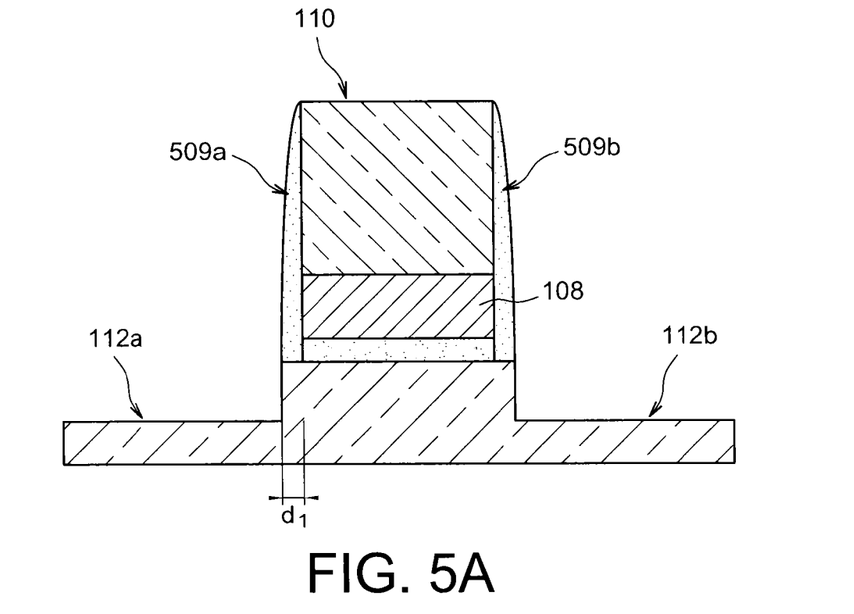
FIG. 5A-5C, illustrate another alternative method wherein protection zones are achieved on a metal area of a transistor's gate prior to the fabrication of insulating spacers.

The masking areas 509a, 509b are achieved for example by depositing a dielectric material, then etching this dielectric material on accesses. The masking areas 509a, 509b can have a very low $d_1$ thickness (measured in a parallel direction

[O,x,y] of the orthogonal reference marker [O,x,y,z] indicated on FIG. 5A) less than 5 nm for example or between 1 and 4 nm.

The masking areas 509a, 509b can be provided to avoid a possible contamination by metal from equipment used during the method, specifically epitaxy equipment.

Figure 5B:
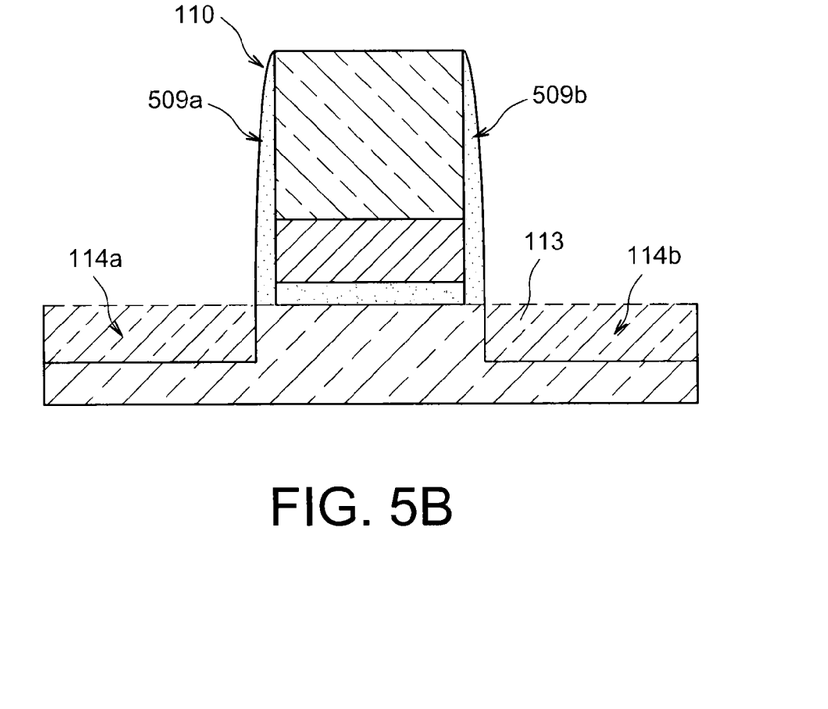

Then, cavities 112a, 112b are formed either side of the gate 110 and the transistor's channel zone.

Then the sacrificial zones are formed 114a, 114b, by epitaxy growth of semi-conductor material in the cavities 112a, 112b.

Figure 5C:
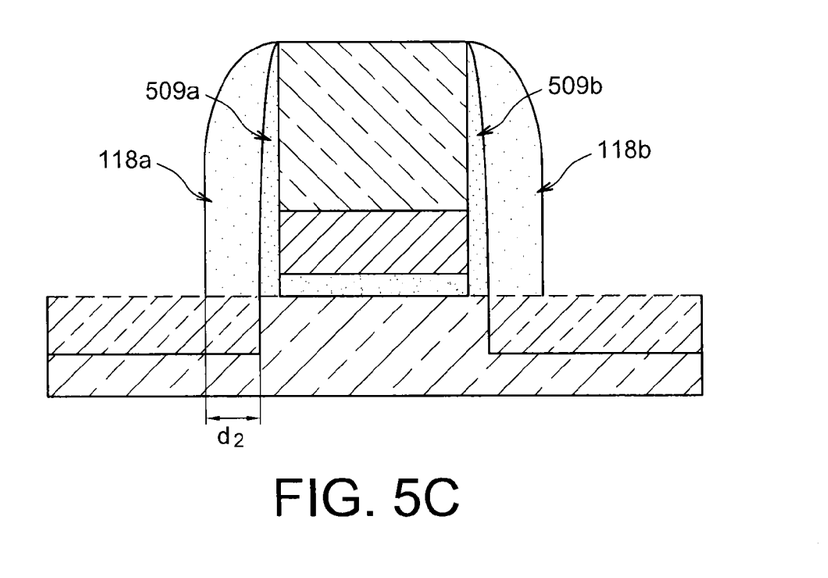

After, insulating spacers 118a, 118b of thickness $d_2$ (with $d_2 > d_1$) can then be formed ($d_2$ being also measured in a parallel direction [O,x,y] of the orthogonal reference marker [O,x,y,z] indicated on FIG. 5A) lining the masking areas 509a, 509b (FIG. 5C).

Then a method can be carried out such as is described previously in connection with FIG. 2E-2F, in which cavities 122a, 122b are formed again, penetrating under the spacers 118a, 118b and revealing the lateral sides of the transistor's channel zone.

After, a growth of semi-conductor material 123 is achieved in cavities 122a, 122b so as to form semi-conductor material based blocks 124a, 124b doped and/or adapted to exert a stress penetrating under the spacers 118a, 118b and in contact with the transistor's channel zone 103c.

A method different to that described previously in connection with FIG. 3A-3E, provides the formation of spacers 118a, 118b against the sides of the transistor's gate 110 (FIG. 6A), prior to the formation of sacrificial zones.

Figure 6A:
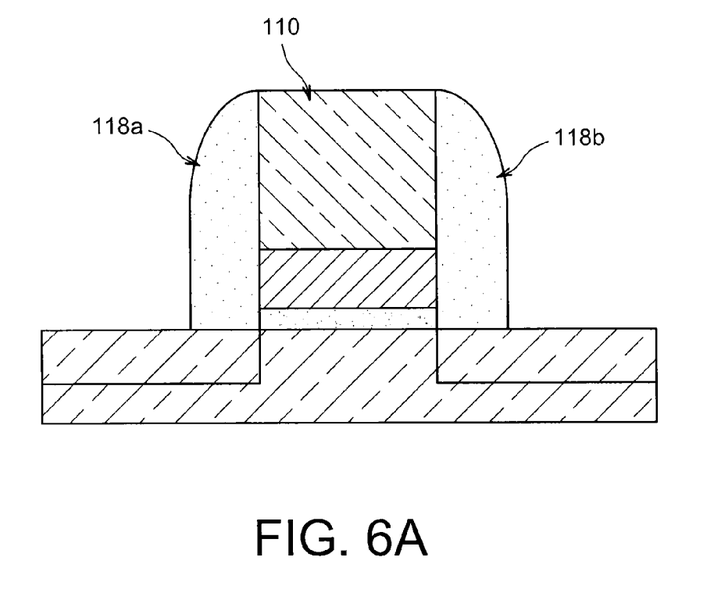
FIG. 6A-6B, illustrate another transistor manufacturing method, wherein sacrificial zones are formed under these spacers, after having obtained the spacers, which are intended to be withdrawn later to form cavities.

Then the sacrificial zones are formed 214a, 214b, by making areas situated either side of the transistor's channel zone 103c amorphous and penetrating under the spacers 118a, 118b.

Figure 6B:
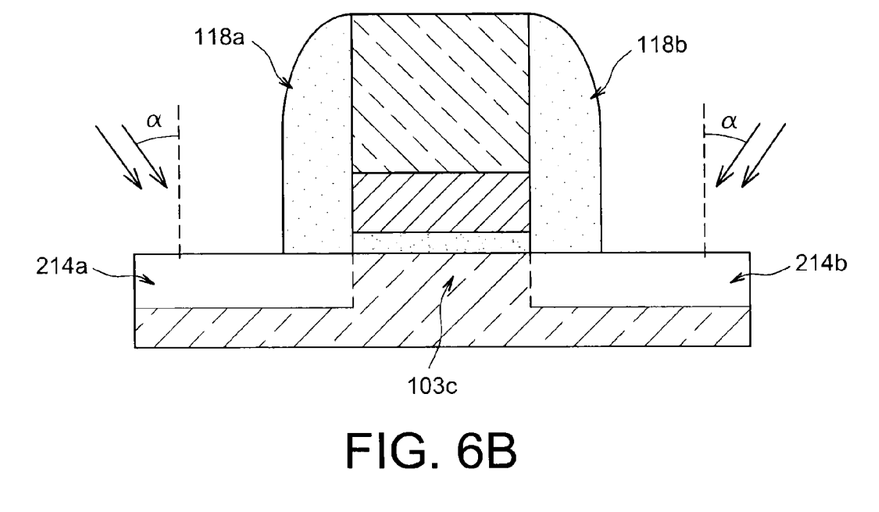

For that, an amorphisation implantation (FIG. 6B) is achieved by means of an inclined beam achieving an α angle, non zero compared with a normal n in the main substrate plane, for example between 20° and 50°, in particular 45°. The implantation can be carried out with the help of Germanium, in accordance with a dose e.g. going from 4 to $8 \times 10^{14} cm^{-2}$ to energies e.g. between 3 and 8 keV. This example of implantation can be specifically provided for a 12 nm silicon area where a thickness of 9 nm of an access area beside the spacers and 6 nm under the spacers is desired to form the sacrificial zones 214a, 214b.

Then steps like those described in connection with FIG. 3D-3E can be carried out. Such steps consist in withdrawing the sacrificial zones so as to form cavities either side of the channel zone and penetrating under the spacers, then filling these cavities with a semi-conductor material that is doped and/or adapted to apply strain.

A method, according to the invention, can be applied for fabricating different transistor structure types, and specifically for forming a transistor comprising a channel structure comprising one or several semi-conductor bars, like MIGFET transistors (for <<Multiple Independent Gate Field Effect Transistor>>), for example so called finFET type transistors or tri-gate transistors which gate extends over several different planes.

The invention claimed is:

1. A method for fabricating a microelectronic transistor(s) device, comprising:
   forming a structure comprising sacrificial zones in a semiconductor layer, either side of a given area of the semiconductor layer in which a transistor channel is to be formed, and insulating spacers against the sides of the transistor gate, with the spacers resting on said sacrificial zones, forming said structure comprising:
   forming a dielectric mask on a sidewall of a gate of said transistor, then
   forming recesses in the semiconductor layer on either side of the gate such that the semiconductor layer in which the transistor channel is to be formed extends to an outer edge of the dielectric mask, then
   forming in the recesses said sacrificial zones, with the sacrificial zones being achieved either side of a given area of the semiconductor layer in which a transistor channel is to be formed, then
   forming against the dielectric mask insulating spacers resting on the sacrificial zones, then,
   removing said sacrificial zones so as to form cavities extending either side of said given area and penetrating under said spacers,
   forming a semiconductor material in said cavities with said semiconductor material penetrating under the spacers and said semiconductor material formed in said cavities and penetrating under said spacers being doped, with the sacrificial zones being based on a material that can be selectively etched with respect to said semiconductor layer.

2. The method according to claim 1, with the sacrificial zones being based on a material adapted to induce mechanical strain on said given area of the semiconductor layer.

3. The method according to claim 1, wherein the sacrificial zones are formed by:
   forming cavities in the semiconductor layer either side of the gate of said transistor,
   filling said cavities with a sacrificial material.

4. The method according to claim 1, wherein said semiconductor layer is Si based, with the sacrificial zones being SiGe based.

5. The method according to claim 1, wherein said semiconductor layer is SiGe based, with the sacrificial zones being SiaGeb based and b>y.

6. The method according to claim 1, wherein said semiconductor layer is based on crystalline semiconductor material, with the sacrificial zones being areas from the semiconductor layer rendered amorphous.

7. The method according to claim 6, wherein said insulating spacers are formed by depositing a dielectric material at a temperature and according to a duration chosen less than a threshold temperature and threshold duration respectively so as to preserve the amorphous nature of the sacrificial zones or to induce a recrystallisation of a thickness of 2 nm of sacrificial zones at the most.

8. The method according to claim 1, wherein the gate comprises a metal area, the dielectric mask covering said metal area.

9. The method according to claim 1, wherein the insulating spacers are formed in contact with the gate.

10. The method according to claim 1, wherein raised source and drain regions, with said semiconductor material formed in said cavities being arranged either side of the gate above said semi-conductor layer.

11. The method according to claim 1, wherein said dielectric mask has a lateral width $d_1$ between 1 and 4 nm.

12. The method according to claim 1, wherein said sacrificial zones comprise epitaxial semiconductor layers.

13. The method according to claim 4, wherein said epitaxial semiconductor layers comprise SiGe alloys.

14. The method according to claim 1, wherein said gate is a metal gate.

15. The method according to claim 1, wherein the semiconductor material in the cavities being formed by epitaxial growth with in situ doping.

16. A method for fabricating a microelectronic transistor(s) device, comprising:
- forming a structure comprising sacrificial zones in a semiconductor layer, either side of a given area of the semiconductor layer in which a transistor channel is to be formed, and insulating spacers against the sides of the transistor gate, with the spacers resting on said sacrificial zones, the completion of said structure comprising:
- forming said sacrificial zones, with the sacrificial zones being achieved either side of a given area of the semiconductor layer in which a transistor channel is to be formed such that said given area of the semiconductor layer in which the transistor channel is to be formed contacts directly to the sacrificial zones, then
- forming insulating spacers on a sidewall of a gate of said transistor, said gate resting on said given area whereas said insulating spacers resting on the sacrificial zones, then after the completion of said structure:
- removing said sacrificial zones so as to form cavities extending either side of said given area and penetrating under said spacers,
- forming a semiconductor material in said cavities by epitaxial growth with in situ doping, with said semiconductor material penetrating under the spacers and said semiconductor material formed in said cavities and penetrating under said spacers being doped, with the sacrificial zones being based on a material that can be selectively etched with respect to said semiconductor layer.

* * * * *